(12) United States Patent
Kando

(10) Patent No.: US 7,489,064 B2
(45) Date of Patent: Feb. 10, 2009

(54) BOUNDARY ACOUSTIC WAVE DEVICE

(75) Inventor: Hajime Kando, Ritto (JP)

(73) Assignee: Murata Manufacturing Co., Ltd, Kyoto (JP)

(*) Notice: Subject to any disclaimer, the term of this patent is extended or adjusted under 35 U.S.C. 154(b) by 0 days.

(21) Appl. No.: 11/970,623

(22) Filed: Jan. 8, 2008

(65) Prior Publication Data

US 2008/0111450 A1    May 15, 2008

Related U.S. Application Data

(63) Continuation of application No. PCT/JP2006/309464, filed on May 11, 2006.

(30) Foreign Application Priority Data

Jul. 22, 2005    (JP)    .............................. 2005-212561

(51) Int. Cl.
*H03H 9/25* (2006.01)
(52) U.S. Cl. ................................. 310/313 A
(58) Field of Classification Search .............. 310/313 A, 310/313 R; 333/193–195
See application file for complete search history.

(56) References Cited

U.S. PATENT DOCUMENTS

| | | | |
|---|---|---|---|
| 6,046,656 A * | 4/2000 | Mishima | ..................... 333/141 |
| 6,218,763 B1 | 4/2001 | Fujimoto et al. | |
| 6,369,667 B1 | 4/2002 | Kadota et al. | |
| 6,437,668 B1 | 8/2002 | Nakao et al. | |
| 6,737,941 B1 | 5/2004 | Tournois | |
| 6,972,508 B2 | 12/2005 | Kandou et al. | |
| 7,009,468 B2 | 3/2006 | Kadota et al. | |
| 7,126,251 B2 | 10/2006 | Solal et al. | |
| 7,323,803 B2 * | 1/2008 | Kando | ..................... 310/313 A |
| 7,355,319 B2 * | 4/2008 | Kando | ..................... 310/313 A |
| 7,360,292 B2 * | 4/2008 | Ladabaum | ................... 29/594 |
| 2003/0168930 A1 | 9/2003 | Kando et al. | |
| 2005/0162048 A1 | 7/2005 | Solal et al. | |
| 2006/0071579 A1 | 4/2006 | Kando | |
| 2006/0175928 A1 | 8/2006 | Kando | |
| 2007/0096592 A1 | 5/2007 | Kadota et al. | |

(Continued)

FOREIGN PATENT DOCUMENTS

EP    1 538 748 A2    6/2005

(Continued)

OTHER PUBLICATIONS

Official communication issued in the International Application No. PCT/JP2006/309464, mailed on Aug. 29, 2006.

(Continued)

*Primary Examiner*—Thomas M Dougherty
(74) *Attorney, Agent, or Firm*—Keating & Bennett, LLP

(57) ABSTRACT

A boundary acoustic wave device includes a quartz substrate, an IDT located on the substrate, and a dielectric arranged so as to cover the IDT. A boundary acoustic wave propagates across a boundary between the quartz substrate and the dielectric. The thickness of the IDT is determined so that the velocity of the SH boundary acoustic wave is below those of a slow transverse wave propagating across the quartz substrate and a slow transverse wave propagating across the dielectric. The Eulerian angles of the quartz substrate lie within hatched regions in FIG. 13.

15 Claims, 9 Drawing Sheets

U.S. PATENT DOCUMENTS

2007/0229192 A1* 10/2007 Miura et al. ............... 333/193

FOREIGN PATENT DOCUMENTS

| JP | 07-046079 A | 2/1995 |
| JP | 07-212174 A | 8/1995 |
| JP | 10-084246 A | 3/1998 |
| JP | 10-335974 A | 12/1998 |
| JP | 2002-152003 A | 5/2002 |
| WO | 98/52279 A1 | 11/1998 |

OTHER PUBLICATIONS

Yamashita, et al., "Highly Piezoelectric SH-Type Boundary Waves", Technical Report of IEICE, Sep. 1996, pp. 21-26.

Official communication issued in counterpart European Application No. 06746273.9, mailed on Sep. 8, 2008.

Abbott et al.: "A Minimal Diffraction Cut of Quartz for High Performance Saw Filters," IEEE Ultrasonics Symposium; Oct. 22-25, 2000 IEEE; pp. 235-239.

Campbell et al.: "A Method for Estimating Optimal Crystal Cuts and Propagation Directions for Excitation for Piezoelectric Surface Waves," IEEE Transactions on Sonics and Ultrasonics; vol. 15; No. 4; Oct. 1968; pp. 209-217.

Irino et al.: "Theoretical Study of Stoneley Waves in a Structure of Two Piezoelectric Media," Acoustical Society of Japan, Collection of Papers; Mar. 1984; 689-690.

"Elastic Wave Device Technology Handbook," Edited by Japan Society for the Promotion of Science; Elastic Wave Device Technology; 150th Committee Meeting; First Impression of the First Edition; Nov. 30, 1991; five pages.

"Nihon Onkyo Gakkai Shi," Journal of the Acoustical Society of Japan; vol. 36; No. 3; 1980; pp. 140-145; (including English abstract).

Hongo et al.: "Analysis of Elastic Boundary Waves in a Quartz/LiTaO3 Structure," Acoustical Society of Japan, Collection of Papers; Sep. 1998; pp. 1055-1056.

* cited by examiner

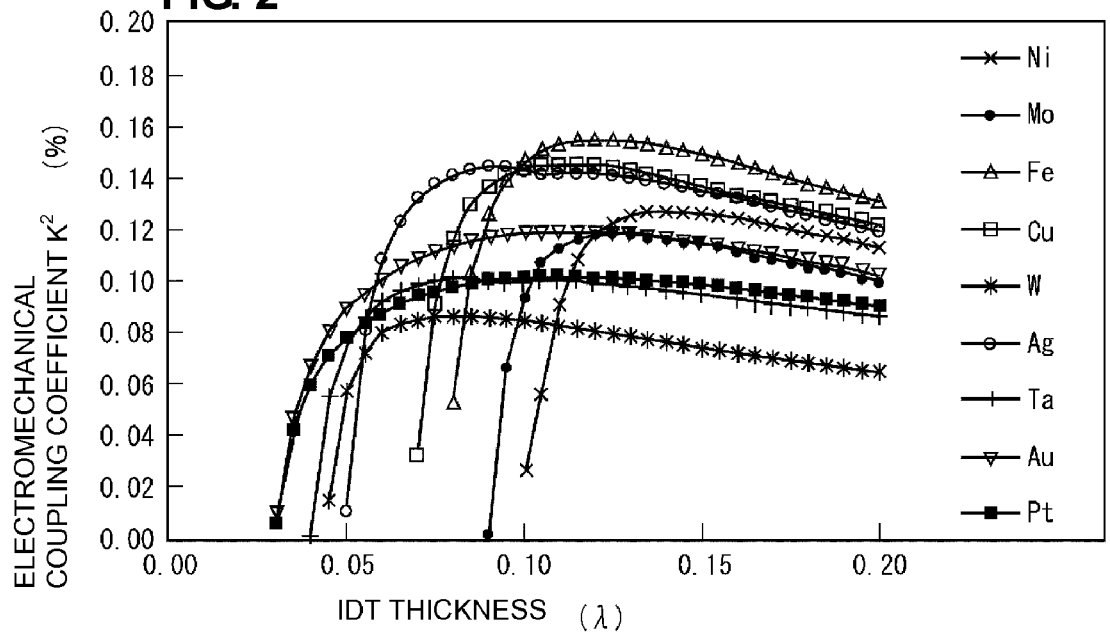
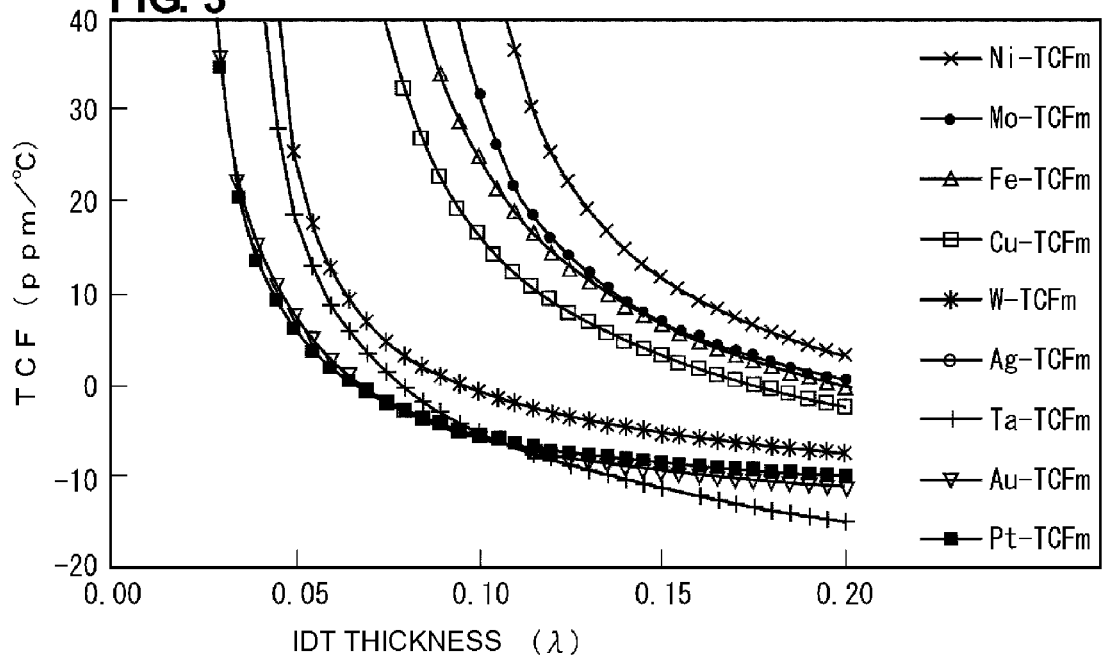

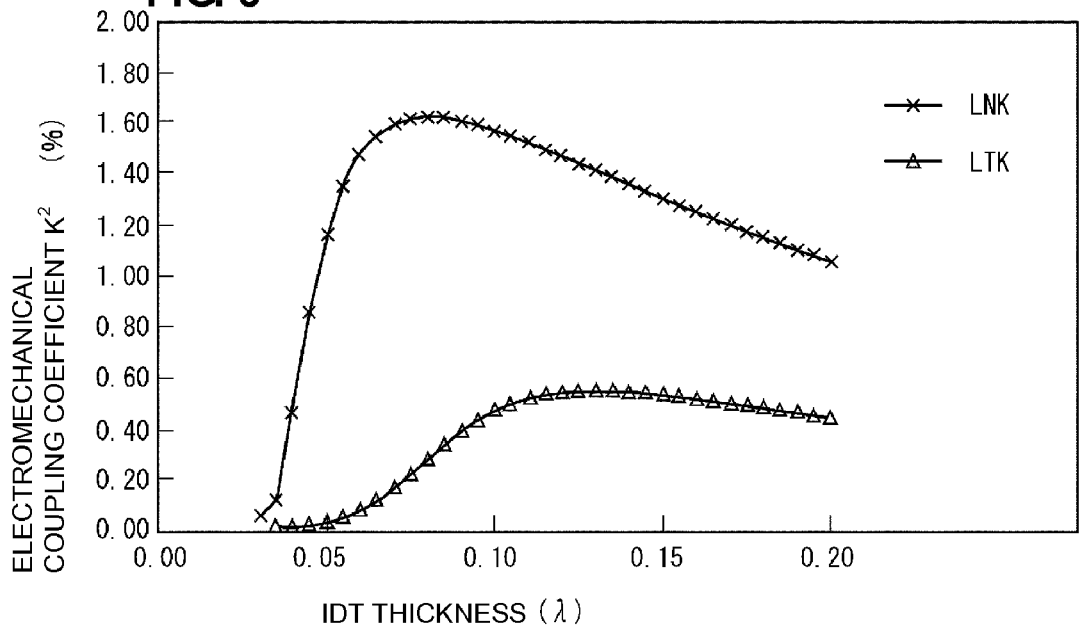
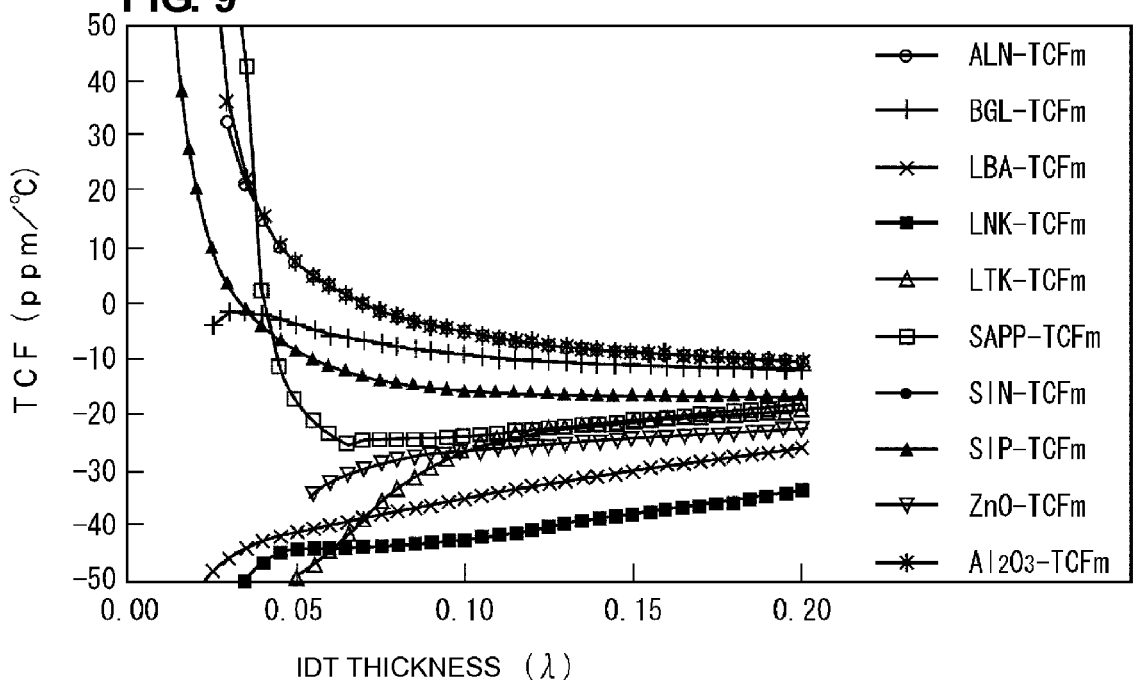

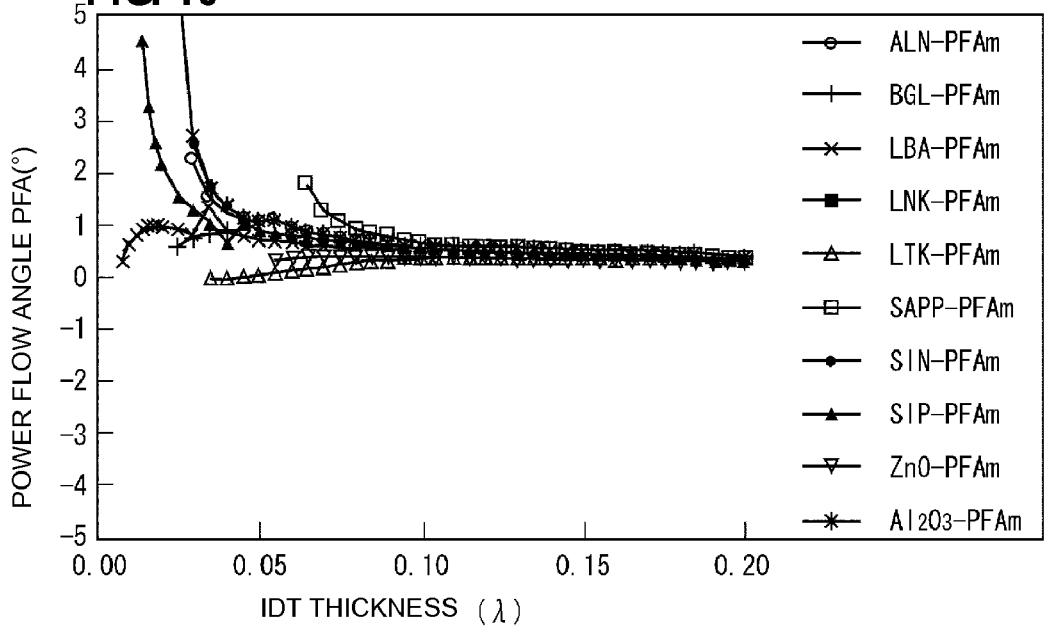
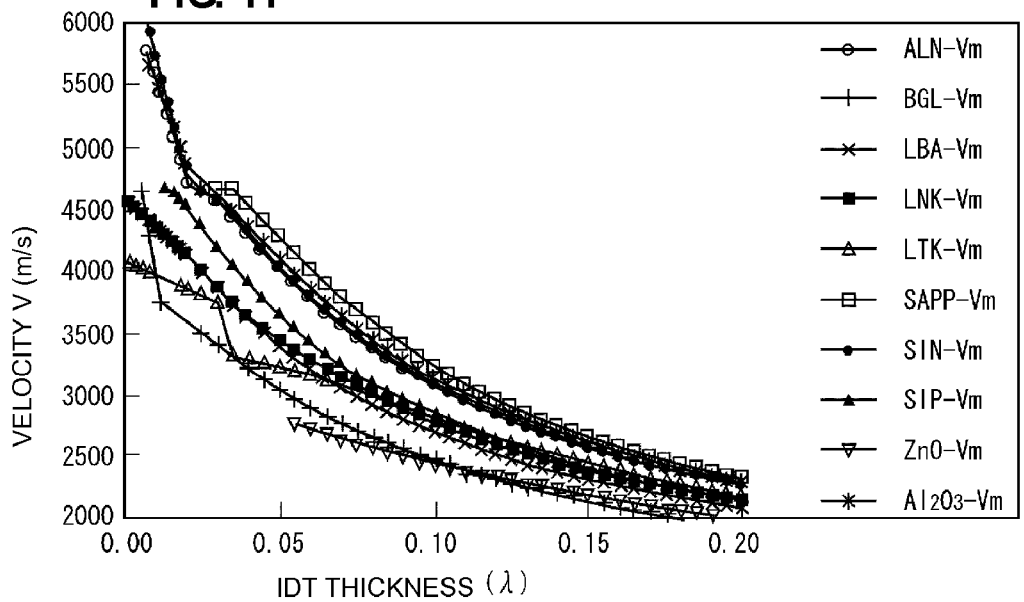

TCF (ppm/°C)

PFA (°)

BOUNDARY ACOUSTIC WAVE DEVICE

BACKGROUND OF THE INVENTION

1. Field of the Invention

The present invention relates to boundary acoustic wave devices that utilize a boundary acoustic wave propagating across a boundary between first and second media, and more specifically, the present invention relates to a boundary acoustic wave device including quartz as the first medium and a dielectric as the second medium.

2. Description of the Related Art

Surface acoustic wave devices have conventionally been widely used in a variety of electronic equipment, including television receivers and cellular phones, to constitute oscillators and bandpass filters. A surface acoustic wave device includes a piezoelectric substrate having at least one interdigital transducer (IDT) formed thereon. The piezoelectric substrate is, for example, a $LiTaO_3$ substrate or a quartz substrate.

A surface acoustic wave filter including a quartz substrate is more suitable for narrow-band applications than one including a $LiTaO_3$ substrate. Accordingly, surface acoustic wave resonators including quartz substrates have conventionally been widely used. This type of surface acoustic wave resonator includes an ST-cut X-propagation quartz substrate, expressed by Eulerian angles (0°, 120°-140°, 0°), on which aluminum comb-like electrodes are arranged to constitute an IDT.

While a smaller difference between resonant frequency and antiresonant frequency, namely, a narrower band width, is desirable for surface acoustic wave resonators, a certain band width is desired even for resonators serving as narrow-band filters to achieve desired characteristics. In addition, a low temperature dependence of pass band is desired for narrow-band filters since their pass bands are highly sensitive to temperature because of the narrow band widths. In terms of such requirements, conventionally, ST-cut X-propagation quartz substrates have been used.

The difference between the resonant frequency and antiresonant frequency of a surface acoustic wave resonator is proportional to the electromechanical coupling coefficient $K^2$ of a piezoelectric substrate. An ST-cut X-propagation quartz substrate has an electromechanical coupling coefficient $K^2$ of about 0.14%.

For the above surface acoustic wave resonator to excite a surface acoustic wave, however, a cavity for allowing oscillations must be formed over the electrodes on the quartz substrate. This increases package cost and size. In addition, metal powder originating from the package, for example, may fall on the electrodes and cause a short-circuit failure.

In contrast, a boundary acoustic wave device according to Japanese Unexamined Patent Application Publication No. 10-84246 uses a boundary acoustic wave propagating between first and second media. This device can reduce the package size and cost and causes no short-circuit failure.

The boundary acoustic wave device according to Japanese Unexamined Patent Application Publication No. 10-84246 includes a first substrate formed of a silicon-based material and having comb-like electrodes formed thereon and a second substrate formed of a piezoelectric material and stacked over the comb-like electrodes. The silicon-based substrate used is, for example, a silicon substrate, an amorphous silicon substrate, or a polysilicon substrate. The piezoelectric material used for the second substrate is, for example, $LiNbO_3$, $LiTaO_3$, or quartz. According to Japanese Unexamined Patent Application Publication No. 10-84246, the use of a Stoneley wave as a boundary acoustic wave can reduce the package size and cost.

PCT Japanese Patent Publication No. 2003-512637 suggests a boundary acoustic wave device including a piezoelectric material as one of first and second media and a piezoelectric or non-piezoelectric material as the other medium. This device causes an SH wave, a pure transverse interfacial wave, to propagate between the first and second media as a boundary acoustic wave. The piezoelectric materials shown are lithium tantalate, lithium niobate, and ST-cut X-propagation quartz.

WO2004-070946 discloses a boundary acoustic wave device including a laminate of piezoelectric and dielectric materials with electrodes formed at the interface therebetween. This device allows propagation of an SH boundary acoustic wave because its velocity falls below those of a slow transverse wave propagating across the piezoelectric material and a slow transverse wave propagating across the dielectric material.

Although Japanese Unexamined Patent Application Publication No. 10-84246 discloses the boundary acoustic wave device including quartz, as described above, the boundary acoustic wave used in the device described in this document is the Stoneley wave. If the Stoneley wave is used, it is difficult to achieve an electromechanical coupling coefficient comparable to that of a surface acoustic wave device or a sufficient reflection coefficient for an IDT and reflectors. Hence, a sufficient band width is difficult to achieve using the boundary acoustic wave device according to Japanese Unexamined Patent Application Publication No. 10-84246.

PCT Japanese Patent Publication No. 2003-512637 suggests the use of an SH boundary acoustic wave, as described above, although it shows no specific conditions where the SH boundary acoustic wave is used.

WO2004-070946 discloses the boundary acoustic wave device that includes the laminate of piezoelectric and dielectric materials and that utilizes an SH boundary acoustic wave. However, the piezoelectric materials shown throughout the document are only piezoelectric single crystals of $LiTaO_3$, $LiNbO_3$, and so on. The use of $LiTaO_3$ or $LiNbO_3$ as the piezoelectric material and $SiO_2$ as the dielectric material provides such conditions that the boundary acoustic wave device can achieve a low temperature coefficient of group delay time (TCD). $LiTaO_3$ and $LiNbO_3$, however, are inherently high in TCD and therefore, readily cause manufacturing variations in the TCD of the boundary acoustic wave device. The manufacturing variations in TCD of the boundary acoustic wave device could be reduced if quartz is used as the piezoelectric material because its TCD is low, although the above-described document shows no specific structure for exploiting an SH boundary acoustic wave using quartz.

SUMMARY OF THE INVENTION

In order to overcome the problems described above, preferred embodiments of the present invention provide a boundary acoustic wave device that can achieve reduced package size and cost, that includes a quartz substrate and utilizes an SH boundary acoustic wave, and that excels in various physical properties and characteristics such as electromechanical coupling coefficient $K^2$.

A first preferred embodiment of the present invention provides a boundary acoustic wave device including a quartz substrate, an IDT located on the quartz substrate, and a dielectric arranged on the quartz substrate so as to cover the IDT. A boundary acoustic wave propagates across a boundary between the quartz substrate and the dielectric. The thickness of the IDT is determined so that the velocity of the boundary acoustic wave falls below those of a slow transverse wave propagating across the quartz substrate and a slow transverse wave propagating across the dielectric. The Eulerian angles of the quartz substrate preferably lie within hatched regions in FIG. 13.

A second preferred embodiment of the present invention provides a boundary acoustic wave device including a quartz substrate, an IDT located on the quartz substrate, and a dielectric arranged on the quartz substrate so as to cover the IDT. A boundary acoustic wave propagates across a boundary between the quartz substrate and the dielectric. The thickness of the IDT is determined so that the velocity of the boundary acoustic wave falls below those of a slow transverse wave propagating across the quartz substrate and a slow transverse wave propagating across the dielectric. The Eulerian angles of the quartz substrate preferably lie within hatched regions in FIG. 14.

A third preferred embodiment of the present invention provides a boundary acoustic wave device including a quartz substrate, an IDT located on the quartz substrate, and a dielectric arranged on the quartz substrate so as to cover the IDT. A boundary acoustic wave propagates across a boundary between the quartz substrate and the dielectric. The thickness of the IDT is determined so that the velocity of the boundary acoustic wave falls below those of a slow transverse wave propagating across the quartz substrate and a slow transverse wave propagating across the dielectric. The Eulerian angles of the quartz substrate preferred lie within hatched regions in FIG. 15.

In a specific aspect of the first preferred embodiment of the present invention, the Eulerian angles preferably lie within the hatched regions in FIG. 14.

In a specific aspect of the first and second preferred embodiments of the present invention, the Eulerian angles preferably lie within the hatched regions in FIG. 15.

In a specific aspect of the first to third preferred embodiment of the present invention, the thickness and width of each electrode finger of the IDT are determined so that the velocity of the boundary acoustic wave falls below those of the slow transverse wave propagating across the quartz and the slow transverse wave propagating across the dielectric.

In various preferred embodiments of the present invention, the IDT is preferably formed of an appropriate conductive material. In a specific aspect of a preferred embodiment of the present invention, the IDT is preferably formed of at least one metal selected from the group consisting of nickel, molybdenum, iron, copper, tungsten, silver, tantalum, gold, and platinum.

In the boundary acoustic wave devices according to various preferred embodiments of the present invention, the material of the dielectric film is not particularly limited, preferably, polycrystalline silicon or amorphous silicon is used.

In addition, the dielectric does not necessarily have to be formed of a silicon-based material, but can be formed of a material selected from the group consisting of aluminum nitride, glass, lithium tetraborate, lithium niobate, lithium tantalate, sapphire, silicon nitride, and alumina.

According to the first preferred embodiment of the present invention, the IDT is disposed at the interface between the quartz substrate and the dielectric. The thickness of the IDT is determined so that the velocity of the boundary acoustic wave falls below those of the slow transverse wave propagating across the quartz substrate and the slow transverse wave propagating across the dielectric, and the Eulerian angles of the quartz substrate preferably lie within the hatched regions in FIG. 13. The boundary acoustic wave device can thus be provided using quartz, which is less expensive than $LiNbO_3$ or $LiTaO_3$. This reduces the cost of the boundary acoustic wave device. In addition, the boundary acoustic wave device can increase the electromechanical coupling coefficient $K^2$ of an SH boundary wave used as the boundary acoustic wave. Thus, a boundary acoustic wave device with a sufficient band width can be provided.

According to the second preferred embodiment of the present invention, the IDT is disposed at the interface between the quartz substrate and the dielectric. The thickness of the IDT is determined so that the velocity of the boundary acoustic wave falls below those of the slow transverse wave propagating across the quartz substrate and the slow transverse wave propagating across the dielectric, and the Eulerian angles of the quartz substrate preferably lie within the hatched regions in FIG. 14. A boundary acoustic wave device that utilizes an SH boundary wave can thus be provided using quartz, which is less expensive than $LiNbO_3$ or $LiTaO_3$. This reduces the cost of the boundary acoustic wave device. In addition, the boundary acoustic wave device can reduce the temperature coefficient of group delay time TCD of the SH boundary wave used. Furthermore, manufacturing variations in TCD due to correction can be reduced because quartz itself has a low TCD.

According to the third preferred embodiment of the present invention, the IDT is disposed at the interface between the quartz substrate and the dielectric. The thickness of the IDT is determined so that the velocity of the boundary acoustic wave falls below those of the slow transverse wave propagating across the quartz substrate and the slow transverse wave propagating across the dielectric, and the Eulerian angles of the quartz substrate preferably lie within the hatched regions in FIG. 15. A boundary acoustic wave device that utilizes an SH boundary wave can thus be provided using quartz, which is less expensive than $LiNbO_3$ and $LiTaO_3$. This reduces the cost of the boundary acoustic wave device. In addition, the power flow angle PFA of the SH boundary wave can be reduced because the Eulerian angles lie within the above specific range.

In the first preferred embodiment of the present invention, if the Eulerian angles of the quartz substrate also lie within the hatched regions in FIG. 14, the boundary acoustic wave device can achieve not only an increased electromechanical coupling coefficient $K^2$, but also a reduced temperature coefficient of group delay time TCD. Furthermore, manufacturing variations in TCD due to correction can be reduced because quartz itself has a low TCD.

In the first and second preferred embodiments of the present invention, if the Eulerian angles of the quartz substrate also lie within the hatched regions in FIG. 15, the boundary acoustic wave devices can achieve an increased electromechanical coupling coefficient $K^2$ and a reduced power flow angle PFA. In addition, if the Eulerian angles lie within the hatched regions in FIGS. 13 to 15, the boundary acoustic wave device can achieve an increased electromechanical coupling coefficient $K^2$, a reduced temperature coefficient of group delay time TCD, and a reduced power flow angle PFA. Furthermore, manufacturing variations in TCD due to correction can be reduced because quartz itself has a low TCD.

In various preferred embodiments of the present invention, the propagation loss can be reduced if the thickness and line width of the IDT are determined so that the velocity of the boundary acoustic wave falls below those of the slow transverse wave propagating across the quartz and the slow transverse wave propagating across the dielectric.

If the IDT is formed of at least one metal selected from the group consisting of nickel, molybdenum, iron, copper, tungsten, silver, tantalum, gold, and platinum, the boundary acoustic wave can be successfully excited by determining the thickness of the IDT appropriately, that is, so that the velocity of the boundary acoustic wave falls below those of the slow transverse wave propagating across the quartz and the slow transverse wave propagating across the dielectric.

If the dielectric is formed of polycrystalline silicon or amorphous silicon, it is possible to provide a relatively wide range of Eulerian angles having such conditions that an increased electromechanical coupling coefficient $K^2$, a reduced temperature coefficient of group delay time TCD, and a reduced power flow angle PFA can be achieved. Thus, a boundary acoustic wave device with excellent characteristics can readily be provided.

If the dielectric is formed of a material selected from the group consisting of aluminum nitride, glass, lithium tetraborate, lithium niobate, lithium tantalate, sapphire, silicon nitride, and alumina, the boundary acoustic wave device can have a relatively wide range of Eulerian angles having such conditions that an increased electromechanical coupling coefficient $K^2$, a reduced temperature coefficient of group delay time TCD, and a reduced power flow angle PFA can be achieved, as in the case where polycrystalline silicon or amorphous silicon is used.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 2 is a graph of analysis results of the boundary acoustic wave device according to a preferred embodiment, showing the relationship between the thickness of an IDT and electromechanical coupling coefficient $K^2$ for various metal materials used for the IDT.

FIG. 3 is a graph of the analysis results of the boundary acoustic wave device according to a preferred embodiment, showing the relationship between the thickness of the IDT and temperature coefficient of frequency TCF for various metal materials used for the IDT.

FIG. 8 is a graph showing the relationship between the thickness of the IDT and the electromechanical coupling coefficient $K^2$ for various dielectric materials in a preferred embodiment of the present invention.

FIG. 9 is a graph showing the relationship between the thickness of the IDT and the temperature coefficient of frequency TCF for various dielectric materials in a preferred embodiment of the present invention.

FIG. 10 is a graph showing the relationship between the thickness of the IDT and the power flow angle PFA for various dielectric materials in a preferred embodiment of the present invention.

FIG. 11 is a graph showing the relationship between the thickness of the IDT and the velocity V of the SH boundary wave for various dielectric materials in a preferred embodiment of the present invention.

DETAILED DESCRIPTION OF PREFERRED EMBODIMENTS

Specific preferred embodiments of the present invention will now be described with reference to the drawings to illustrate the present invention.

Figure 1A:
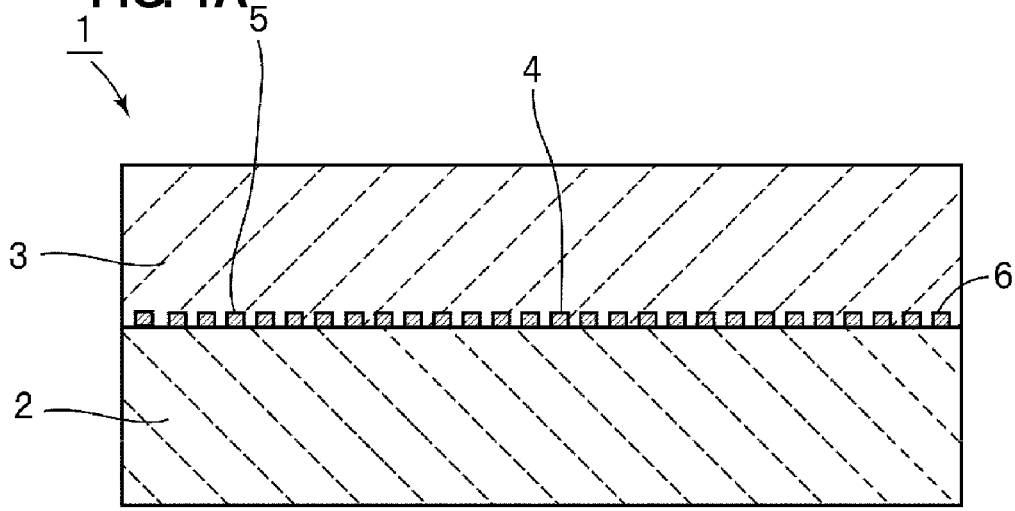
FIGS. 1A and 1B are a schematic front sectional view and a schematic plan sectional view, respectively, of a boundary acoustic wave device according to a preferred embodiment of the present invention.
Figure 1B:
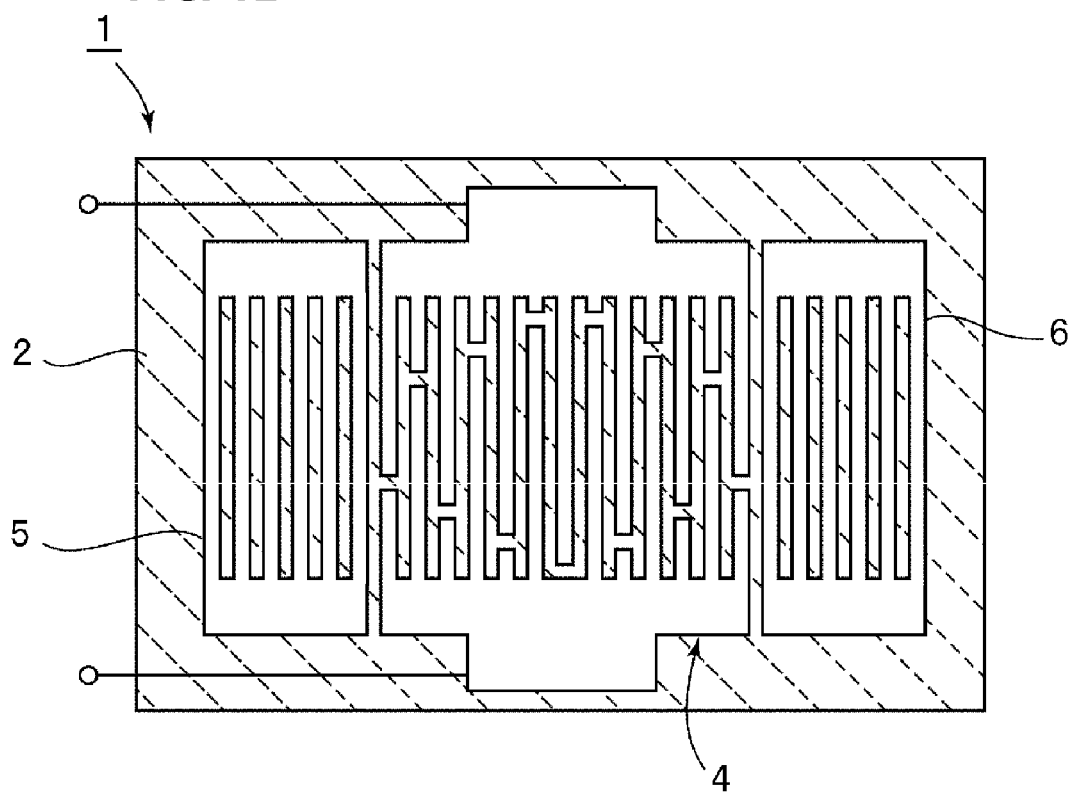

FIGS. 1A and 1B are a schematic front sectional view and a schematic plan sectional view, respectively, of a boundary acoustic wave device according to a preferred embodiment of the present invention.

A boundary acoustic wave device 1 of this preferred embodiment includes a quartz substrate 2 and a dielectric 3 preferably formed of polysilicon and stacked on the quartz substrate 2. An electrode structure is formed between the quartz substrate 2 and the dielectric 3, as schematically shown in FIG. 1B. This electrode structure includes an IDT 4 and reflectors 5 and 6 disposed on the sides of the IDT 4 in a direction in which a boundary acoustic wave propagates. The IDT 4 and the reflectors 5 and 6 are formed of a metal described later. The cross width of the IDT 4 is weighted, as shown, although it does not have to be weighted.

The boundary acoustic wave device 1 of this preferred embodiment preferably is a one-port boundary acoustic wave resonator having the above-described electrode structure.

The thickness of the IDT 4 of the boundary acoustic wave device 1 is determined so that an SH boundary acoustic wave propagates at a lower velocity than a slow transverse wave propagating across the quartz substrate 2 and a slow transverse wave propagating across the dielectric 3. The boundary acoustic wave device 1 is thus configured to utilize the SH boundary acoustic wave.

In a structure including an IDT formed at the interface between a piezoelectric material, such as the quartz substrate 2, and the dielectric, an SH boundary acoustic wave can propagate across the interface if its velocity falls below those of a slow transverse wave propagating across the piezoelectric material and a slow transverse wave propagating across the dielectric, as disclosed in, for example, WO2004-070946.

The boundary acoustic wave device 1 was examined for the relationships between the thickness of the electrodes and the velocity of the SH boundary acoustic wave, which mainly contains an SH wave, electromechanical coupling coefficient $K^2$, propagation loss $\alpha$, and temperature coefficient of frequency TCF using nickel, molybdenum, iron, copper, tungsten, silver, tantalum, gold, and platinum as the electrode materials for the IDT 4 and the reflectors 5 and 6. The results are shown in FIGS. 2 to 6. The results shown in FIGS. 2 to 6 were obtained by calculations based on a method disclosed in the document "A Method for Estimating Optimal Cuts and Propagation Directions for Excitation and Propagation Direction for Excitation of Piezoelectric Surface Waves" (J. J. Campbell and W. R. Jones, IEEE Trans. Sonics and Ultrason., vol. SU-15 (1968) pp. 209-217) under the following conditions.

Calculation Conditions

Dielectric(SiN)/IDT/Quartz Substrate

The thicknesses of SiN, used as the dielectric, and the quartz substrate were infinity. The crystal orientation of the quartz substrate was 55° Y-cut 90° X-propagation (Eulerian angles (0°, 145°, 90°)).

The velocities of a longitudinal wave, a fast transverse wave, and a slow transverse wave propagating across the rotated Y-plate X-propagation quartz substrate were about 5,799 m/s, about 4,881 m/s, and about 4,139 m/s, respectively. The velocities of a longitudinal wave and a slow transverse wave propagating across the SiN were about 10,642 m/s and about 5,973 m/s, respectively.

Under open-circuit boundary conditions, the velocity and the propagation loss were determined under the conditions where the displacements, the potentials, the normal components of electric displacements, and the vertical stresses at the boundaries between the quartz substrate and the electrodes and between the electrodes and the dielectric were continuous, the thicknesses of the quartz substrate and the dielectric were infinity, and the electrodes had a relative dielectric constant of 1. Under short-circuit boundary conditions, the potentials at the boundaries between the dielectric and the electrodes and between the electrodes and the quartz substrate were zero. The electromechanical coupling coefficient $K^2$ was determined by Equation (1):

$$K^2 = 2|Vf - Vm|/Vf \qquad (1)$$

where Vf is the velocity under open-circuit boundary conditions and Vm is the velocity under short-circuit boundary conditions.

The temperature coefficient of frequency TCF was determined by Equation (2):

$$TCF = V[20°\ C.]^{-1} \times \{(V[30°\ C.] - V[20°\ C.]) \div 10°\ C.\} - \alpha s \qquad (2)$$

where V[20° C.], V[25° C.], and V[30° C.] are the velocities of a boundary wave at approximately 20° C., 25° C., and 30° C., respectively.

The temperature coefficient of group delay time TCD was determined by Equation (2A):

$$TCD = -V[25°\ C.]^{-1} \times \{(V[30°\ C.] - V[20°\ C.]) \div 10°\ C.\} - \alpha s \qquad (2A)$$

In Equations (2) and (2A), as is the linear expansion coefficient of the quartz substrate in a direction in which a boundary wave propagates.

The power flow angle PFA of the quartz substrate for any Eulerian angles (φ,θ,ψ) was determined based on the velocities V of a boundary wave for ψ−0.5°, ψ, and ψ+0.5° by Equation (3):

$$PFA = \tan^{-1}\{V[\psi]^{-1} \times (V[\psi+0.5°] - V[\psi-0.5°])\} \qquad (3)$$

Figure 4:
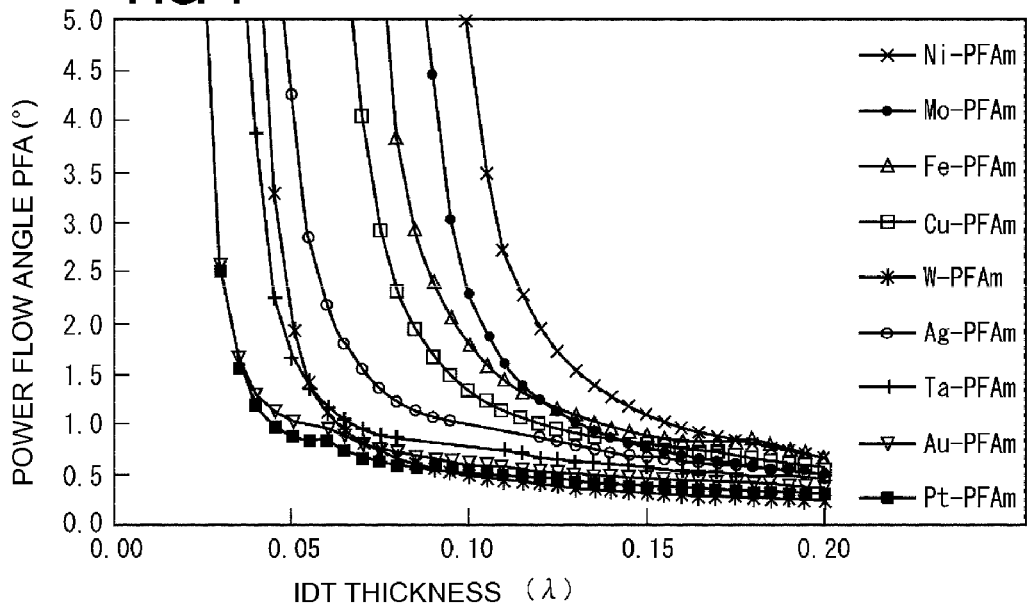
FIG. 4 is a graph of the analysis results of the boundary acoustic wave device according to a preferred embodiment, showing the relationship between the thickness of the IDT and power flow angle PFA for various metal materials used for the IDT.
Figure 5:
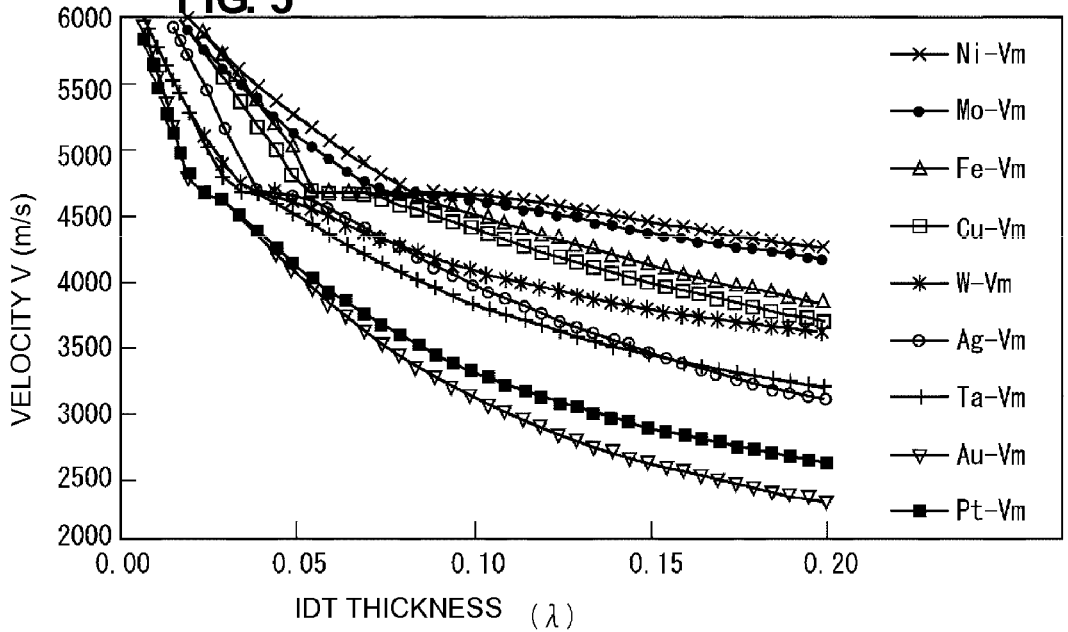
FIG. 5 is a graph of the analysis results of the boundary acoustic wave device according to a preferred embodiment, showing the relationship between the thickness of the IDT and the velocity V of an SH boundary wave for various metal materials used for the IDT.
Figure 6:
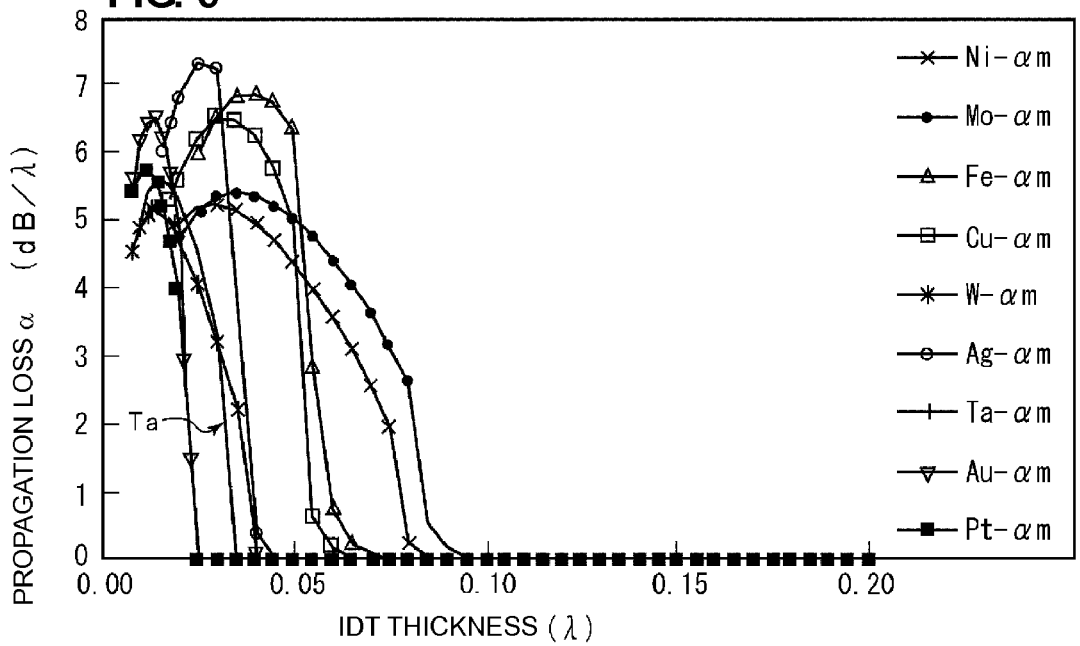
FIG. 6 is a graph of the analysis results of the boundary acoustic wave device according to a preferred embodiment, showing the relationship between the thickness of the IDT and propagation loss α for various metal materials used for the IDT.

FIG. 2 is a graph showing the relationship, determined as described above, between the thickness of the IDT and the electromechanical coupling coefficient of the SH boundary wave. FIG. 3 is a graph showing the relationship between the thickness of the IDT and the temperature coefficient of frequency TCF. FIG. 4 is a graph showing the relationship between the thickness of the IDT and the power flow angle PFA. FIG. 5 is a graph showing the relationship between the thickness of the IDT and the velocity of the SH boundary wave. FIG. 6 is a graph showing the relationship between the thickness of the IDT and the propagation loss $\alpha$.

FIGS. 5 and 6 show that the SH boundary wave has a low propagation loss $\alpha$, namely, zero, for any of the above metals used if the thickness of the IDT is increased so that the velocity of the SH boundary wave falls below about 4,139 m/s, the velocity of the slowest wave among the longitudinal waves, the fast transverse wave, and the slow transverse waves described above. As an example, the case where the IDT is formed of gold will be described. If a gold IDT is used, as shown in FIG. 5, the velocity falls below about 4,139 m/s at an IDT thickness of about 0.05λ or more. If a nickel IDT is used, as shown in FIG. 6, the propagation loss $\alpha$ is nearly zero at an IDT thickness of about 0.05λ or more. The thicknesses of the metal films at which the velocity of the SH boundary wave falls below about 4,139 m/s in FIG. 5 do not completely agree with the thicknesses of the metal films at which the propagation loss $\alpha$ decreases gradually and reaches nearly zero. This is because the propagation loss $\alpha$ drops suddenly at the IDT thickness at which the velocity of the SH boundary wave falls below that of the fast transverse wave of quartz (about 4,881 m/s); for some metals, the propagation loss $\alpha$ drops to nearly zero. More preferably, because a propagation loss $\alpha$ of zero is desirable, the thickness of the IDT is determined so that the velocity of the SH boundary wave falls below about 4,139 m/s in FIG. 5. The thickness of the IDT, however, does not necessarily have to be determined within such a region that the velocity of the SH boundary wave falls below about 4,139 m/s in FIG. 5; a boundary acoustic wave device with superior characteristics can be provided by setting the design thickness range of the IDT to a range where the propagation loss $\alpha$ decreases to a level acceptable for practical use in FIG. 6 and determining the thickness of the IDT in terms of the other conditions.

The above-described results demonstrate that the boundary acoustic wave device including the quartz substrate can propagate the SH boundary wave with little loss even though the quartz substrate has Eulerian angles where the substrate is conventionally thought to be unable to propagate the SH boundary wave.

In addition, a comparison of FIG. 2 to FIG. 5 demonstrates that the electromechanical coupling coefficient $K^2$ can be sufficiently increased for any of the metals used for the IDT if its thickness is determined so that the velocity of the SH boundary wave falls below about 4,139 m/s.

Furthermore, a comparison of FIGS. 3 and 4 to FIG. 5 demonstrates that the TCF and PFA can be sufficiently reduced if the thickness of the IDT is determined so that the velocity of the SH boundary wave falls below about 4,139 m/s.

The results of FIGS. 2 to 6 thus demonstrate that the boundary acoustic wave device according to this preferred embodiment can achieve almost no propagation loss, a sufficiently high electromechanical coupling coefficient $K^2$, a low temperature coefficient of frequency TCF, and a small power flow angle PFA irrespective of the metal material used for the IDT if its thickness is determined so that the velocity of the SH boundary wave falls below those of the slow transverse wave propagating across the quartz substrate and the slow transverse wave propagating across the SiN.

FIGS. 7 to 12 show the relationships between the thickness of the IDT and the velocity of the SH boundary acoustic wave, the electromechanical coupling coefficient $K^2$, the propagation loss, and the temperature coefficient of frequency TCF for SiN and other dielectric materials, including aluminum nitride (AlN), glass (BGL), lithium tetraborate (LBA), lithium niobate (LNK), lithium tantalate (LTK), sapphire (SAPP), polysilicon (SIP), zinc oxide (ZnO), and alumina ($Al_2O_3$).

The results shown in FIGS. 7 to 12 were obtained using a quartz substrate/IDT/dielectric multilayer structure under the conditions that the thickness of the quartz substrate was infinity, the cut angle of the quartz substrate was 55° Y-cut 90° X-propagation (Eulerian angles (0°, 145°, 90°)), the same as in the calculation example described above, and the thickness of the dielectric was infinity.

The results of FIGS. 7 to 12 were obtained by the same calculations as used in obtaining the results shown in FIGS. 2 to 6.

The velocity of the slow transverse wave propagating across the quartz substrate, as described above, is about 4,139 m/s. The velocities of slow transverse waves propagating across the above dielectric materials are higher than about 4,139 m/s. Hence, the SH boundary wave can propagate if its velocity falls below about 4,139 m/s. In other words, the SH boundary wave can be used by selecting the thickness range of the IDT where the velocity V falls below about 4,139 m/s in FIG. 11. A comparison of FIG. 12 to FIG. 11 demonstrates that the propagation loss α is substantially zero for various dielectric materials if the thickness of the IDT is determined under such conditions that the SH boundary wave can propagate, that is, within the range where the velocity V of the SH boundary wave falls below about 4,139 m/s. Like the calculation results shown in FIGS. 5 and 6, therefore, the above results demonstrate that the SH boundary wave can also propagate with little loss for the dielectric materials other than SiN if the thickness of the IDT is determined so that the velocity of the SH boundary wave falls below about 4,139 m/s.

Figure 7:
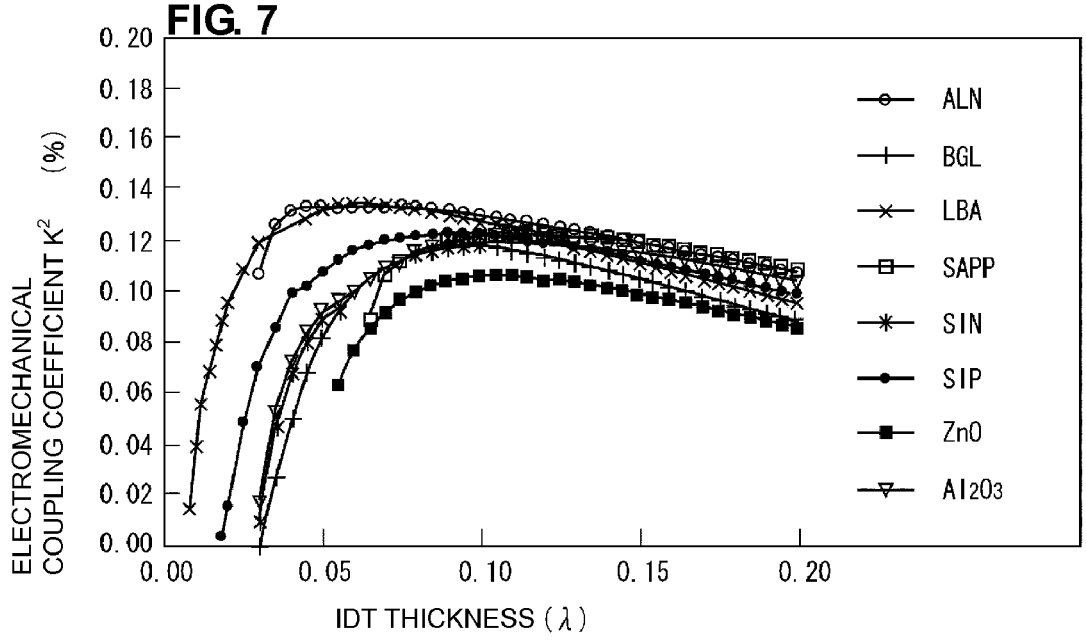
FIG. 7 is a graph showing the relationship between the thickness of the IDT and the electromechanical coupling coefficient $K^2$ for various dielectric materials in a preferred embodiment of the present invention.
Figure 12:
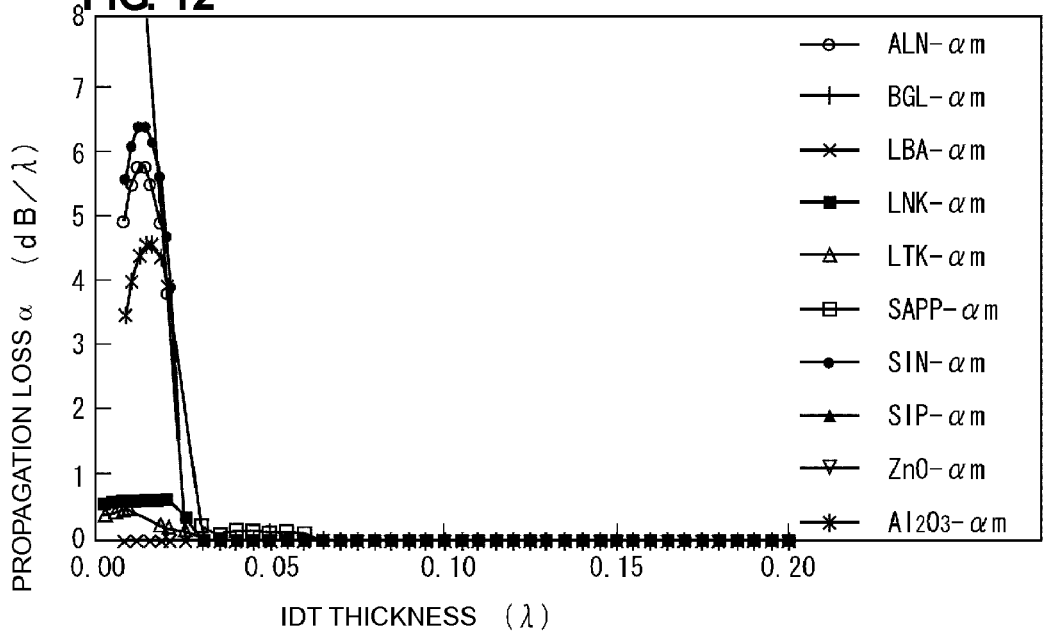
FIG. 12 is a graph showing the relationship between the thickness of the IDT and the propagation loss α for various dielectric materials in a preferred embodiment of the present invention.

FIG. 7 shows that the electromechanical coupling coefficient $K^2$ of the SH boundary wave can be sufficiently increased if the thickness of the IDT is determined as described above. If the dielectric used is AlN, for example, the loss of the SH boundary wave can be nearly zero at an IDT thickness of about 0.02λ or more, as shown in FIG. 12; at the same time, the electromechanical coupling coefficient $K^2$ can be about 0.05% or more, as shown in FIG. 7.

FIGS. 7 to 12 show that a sufficiently high electromechanical coupling coefficient $K^2$ can also be achieved for the dielectric materials other than SiN.

The results of FIGS. 2 to 6 and FIGS. 7 to 12 thus demonstrate that the boundary acoustic wave device can achieve a sufficiently high electromechanical coupling coefficient $K^2$, a low temperature coefficient of frequency TCF, and a small PFA using a quartz substrate having Eulerian angles (0°, 145°, 90°) for various IDT and dielectric materials if the thickness of the IDT is determined so that the velocity of the SH boundary wave falls below about 4,139 m/s.

Next, variations in the electromechanical coupling coefficient $K^2$, the temperature coefficient of frequency TCF, the power flow angle PFA, and the velocity V of the SH boundary wave of the boundary acoustic wave device 1, produced as a boundary acoustic wave resonator, for various Eulerian angles of the quartz substrate 2 were calculated, and the results are shown in FIGS. 13 to 16.

The conditions were as follows.

Structure

The dielectric 2 was formed of polycrystalline silicon. The Eulerian angles of the quartz substrate were varied, and its thickness was infinity.

The IDT was formed of gold and had a thickness of about 0.07λ.

A resonator produced using the boundary acoustic wave device 1 shown in FIG. 1 oscillates more readily with increasing electromechanical coupling coefficient $K^2$. The inventors of the present application have confirmed that the oscillation becomes difficult if the electromechanical coupling coefficient $K^2$ falls below about 0.08%.

Figure 13:
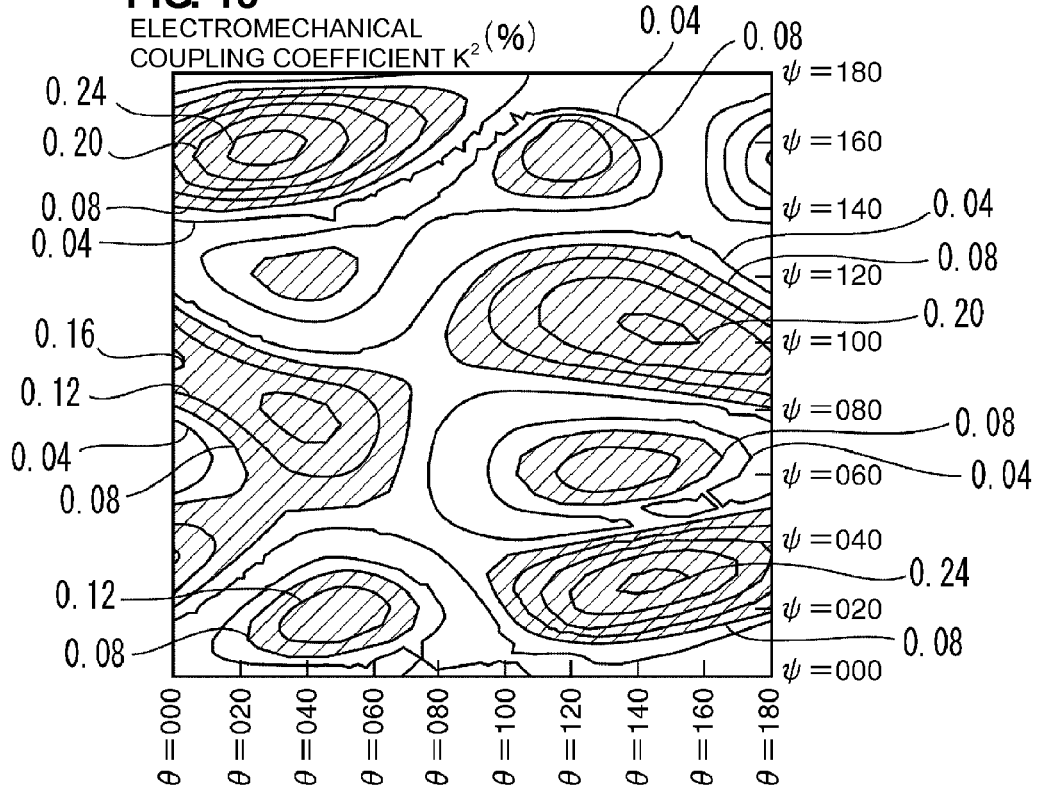
FIG. 13 is a graph showing the relationship between the θ and ψ of a quartz substrate having Eulerian angles (0°,θ,ψ) and the electromechanical coupling coefficient $K^2$ in a preferred embodiment.
Figure 14:
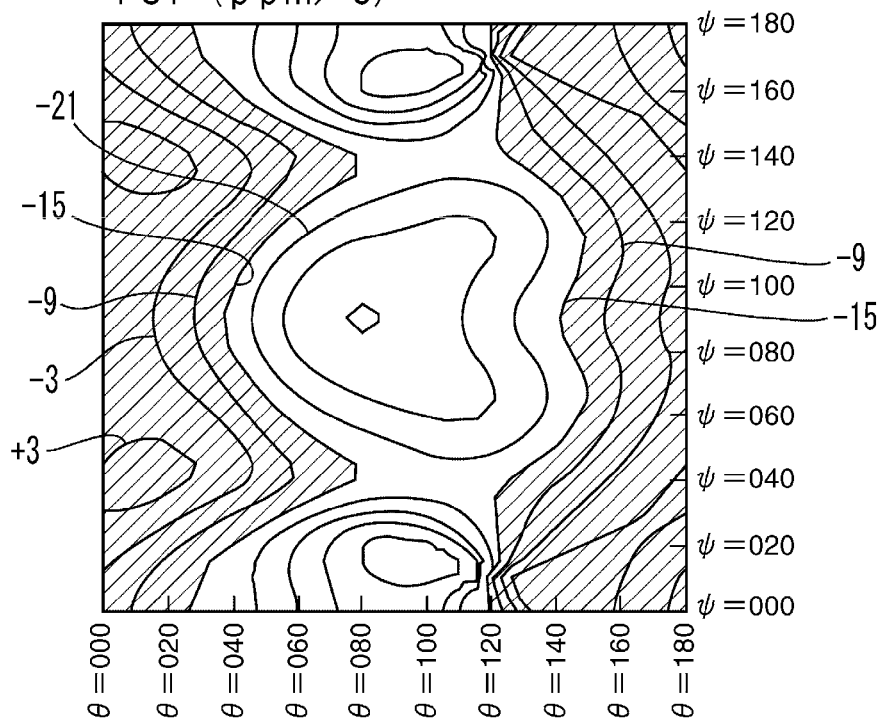
FIG. 14 is a graph showing the relationship between the θ and ψ of the quartz substrate having Eulerian angles (0°,θ,ψ) and the temperature coefficient of frequency TCF in a preferred embodiment.
Figure 15:
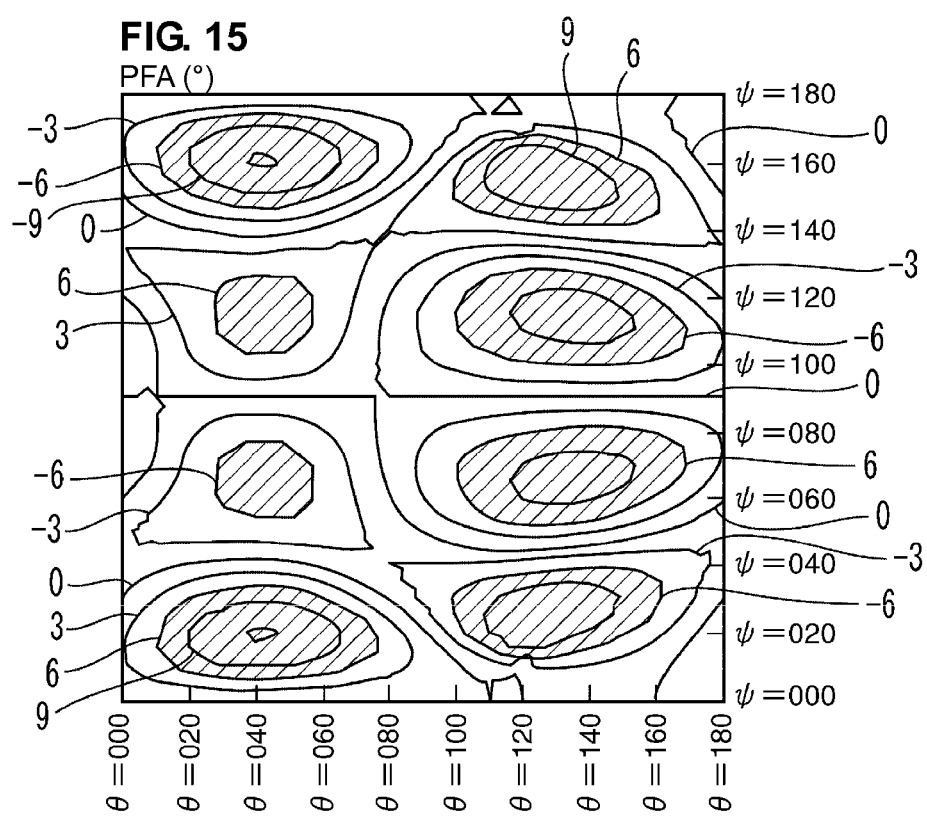
FIG. 15 is a graph showing the relationship between the θ and ψ of the quartz substrate having Eulerian angles (0°,θ,ψ) and the power flow angle PFA in a preferred embodiment.
Figure 16:
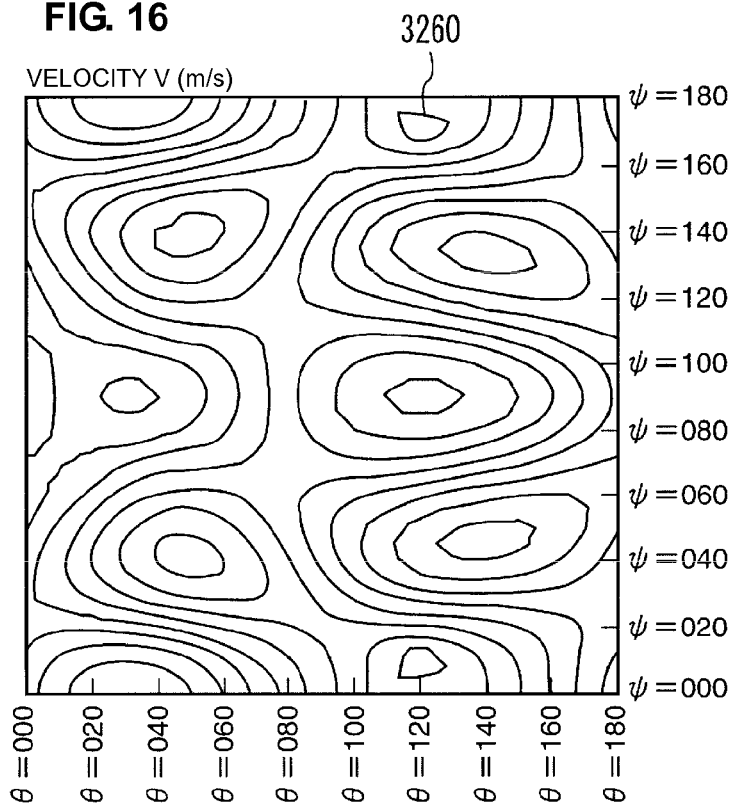
FIG. 16 is a graph showing the relationship between the θ and ψ of the quartz substrate having Eulerian angles (0°,θ,ψ) and the velocity in a preferred embodiment.

The boundary acoustic wave device 1 can have an electromechanical coupling coefficient $K^2$ of about 0.08% or more to oscillate successfully if the θ and ψ of the quartz substrate having Eulerian angles (0°, θ, ψ) lie within the hatched regions shown in FIG. 13.

The temperature coefficient of group delay time TCD is positive for a transverse wave propagating across the dielectric and is negative for a transverse wave propagating across the quartz. The temperature coefficient of group delay time TCD is represented by the following equation:

$$TCD = \alpha s - TCVs \quad (4)$$

where TCVs is the temperature coefficient of velocity of a transverse wave and αs is the linear expansion coefficient of a material in a direction in which an SH boundary wave propagates.

If a boundary acoustic wave device having a dielectric/IDT/quartz substrate structure is produced by forming an IDT on a quartz substrate having a thickness of about 100λ by photolithography and forming the dielectric to such a thickness that it can sufficiently confine oscillations, for example, about 0.8λ, by a deposition method such as sputtering, the linear expansion coefficient of the quartz substrate becomes predominant as the linear expansion coefficient as of Equation (4), with the linear expansion coefficient of the dielectric being negligible. The temperature coefficient of group delay time TCD of the SH boundary wave, in which the transverse-wave component is predominant, is determined between the velocities of the transverse waves propagating across the dielectric and the quartz substrate. Dielectric materials used for boundary acoustic wave devices have temperature coefficients of velocity TCVs of about −10 ppm/° C. to about −40 ppm/° C. The polysilicon used in obtaining the results shown in FIGS. 13 to 16 was about −25 ppm/° C.

Hence, a boundary acoustic wave device having a temperature coefficient of group delay time TCD of nearly zero can be provided using quartz in combination with a dielectric having a negative temperature coefficient of velocity TCVs if the quartz has a cut angle with a TCV of less than about +15 in FIGS. 13 to 16 (a TCF of more than about −15; because the TCVs of the polysilicon is about −25, the difference is about +10, and the TCD is approximately zero if a dielectric having a TCV of about −10 is used in combination). Accordingly, a boundary acoustic wave device having a temperature coefficient of frequency TCF of nearly zero can be provided using a quartz substrate having Eulerian angles within a region where the TCF is more than about −15 ppm/° C. in FIG. 14, that is, within the hatched regions of FIG. 14.

The power flow angle PFA represents the difference between the direction of the phase velocity of a boundary acoustic wave and the direction of a group velocity at which the energy of the boundary acoustic wave travels. If the power flow angle PFA is large, the IDT must be inclined in response to the power flow angle PFA. This involves a complicated electrode design and often causes a loss due to angular deviation. Hence, a smaller power flow angle PFA is preferred for a boundary acoustic wave.

The loss due to angular deviation is significantly low if the power flow angle PFA lies within the range of about +6° to about −6°. The power flow angle PFA can be larger than about −6° and smaller than about +6° within the hatched regions shown in FIG. 15, where the loss can be effectively suppressed.

While the results of the case where the gold IDT electrodes were used are shown in FIGS. 13 to 16, the inventors of the present application have also confirmed that other IDT electrode materials have the same tendency as shown in FIGS. 13 to 16 except for the absolute value of the electromechanical coupling coefficient. For example, the inventors have confirmed that the same contour distributions as shown in FIGS. 13 to 16 are obtained if a copper IDT is used.

The present invention is not limited to a boundary acoustic wave resonator as shown in FIGS. 1A and 1B, but may be applied to various boundary acoustic wave devices, including ladder filters, longitudinally coupled resonator filters, transverse coupling resonator filters, transversal filters, boundary acoustic wave optical switches, and boundary acoustic wave optical filters.

A narrow-band surface acoustic wave filter, such as a resonator surface acoustic wave filter or a ladder surface acoustic wave filter, including a quartz substrate requires electrodes with a high reflection coefficient to achieve sufficiently high attenuation. A typical surface wave filter including a quartz substrate uses aluminum electrodes with a thickness of about 0.7λ or more, where λ is the wavelength of a surface wave. These electrodes have a reflection coefficient of about 0.08 for each electrode finger.

Figure 17:
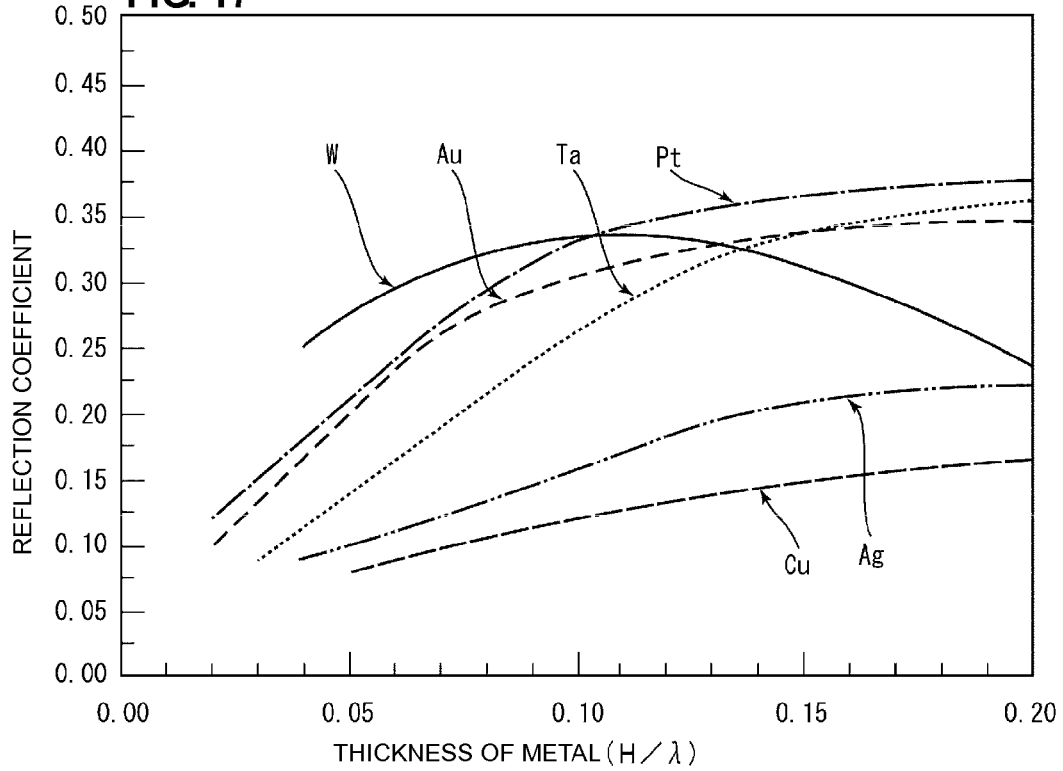
FIG. 17 is a graph showing the relationship between the metal thickness and reflection coefficient of a multilayer structure of metal and SiN on a quartz substrate having Eulerian angles (0°, 127°, 90°).

In various preferred embodiments of the present invention, if the SiN has a thickness of λ, the reflection coefficient of the IDT for each electrode finger is as shown in FIG. 17. FIG. 17 is a graph showing the relationship between the thicknesses of various metal electrodes used for the IDT and the reflection coefficient. FIG. 17 shows that copper electrodes with a thickness of about 0.07λ or more has a reflection coefficient of about 0.08 or more. The reflection coefficients of electrodes formed of the other metals all have about 0.08 or more within the range shown.

Hence, a sufficiently high attenuation can reliably be achieved.

The individual electrodes, including the IDT, which can be formed of the metals described above, may have a multilayer structure including another electrode layer. Specifically, a thin layer of, for example, titanium, chromium, nickel-chromium, or nickel may be formed on the electrodes to enhance adhesion and power resistance. The formation of the thin electrode layer at the interface between the electrodes and the dielectric or quartz substrate or between metal layers can enhance, for example, adhesion and power resistance.

The thickness of the IDT can readily be adjusted by various methods such as reverse sputtering, ion beam milling, RIE, and wet etching after a metal film to form the IDT is formed on the quartz substrate.

The boundary acoustic wave device according to preferred embodiments of the present invention may further include another dielectric disposed on the surface of the dielectric opposite the quartz substrate.

The boundary acoustic wave device may further include a protective layer disposed outside the quartz substrate/IDT/dielectric structure to enhance the strength of the boundary acoustic wave device or to prevent intrusion of a corrosive gas. The protective layer may be formed of an insulating material such as polyimide, epoxy resin, titanium oxide, aluminum nitride, or aluminum oxide or a metal film such as gold, aluminum, or tungsten. In addition, the boundary acoustic wave device according to preferred embodiments of the present invention may optionally be sealed in a package.

In the present specification, the terms "Eulerian angles", "crystal axis", and "equivalent Eulerian angles" have the following meanings.

Eulerian Angles

The Eulerian angles $(\phi,\theta,\psi)$ used in the present specification to express a cut plane of a substrate and the propagating direction of a boundary wave are right-handed Eulerian angles described in the document "Danseiha Soshi Gijutu handobukku (Acoustic Wave Device Technology Handbook)" (Japan Society for the Promotion of Science, the 150th Committee on Acoustic Wave Device Technology, the first impression of the first edition, published on Nov. 30, 1991, p. 549). Of the crystal axes X, Y, and Z of quartz, the X axis is rotated $\phi$ counterclockwise about the Z axis to obtain an Xa axis. The Z axis is in turn rotated $\theta$ counterclockwise about the Xa axis to obtain a Z' axis. A plane containing the Xa axis and normal to the Z' axis is defined as a cut plane of a substrate. The direction of an X' axis obtained by rotating the Xa axis $\psi$ counterclockwise about the Z' axis is defined as a direction in which a surface wave propagates. An axis perpendicular to the X' and Z' axes which results from a shift of the Y axis after the above rotations is defined as a Y' axis.

Crystal Axis

Of the crystal axes X, Y, and Z of quartz, given as the initial values of Eulerian angles, the Z axis is parallel to a c-axis, the X axis is parallel to any of three equivalent a-axes, and the Y axis is a direction normal to a plane containing the X and Z axes.

Equivalent Eulerian Angles

The Eulerian angles $(\phi,\theta,\psi)$ of a quartz substrate in preferred embodiments of the present invention may be any crystallographically equivalent Eulerian angles. According to the document "Nihon Onkyo Gakkai shi (Journal of The Acoustical Society of Japan), Vol. 36, No. 3, 1980, pp. 140-145", for example, quartz is a trigonal crystal belonging to Point Group 3m and therefore satisfies Equation (100):

$$\begin{aligned} F(\varphi, \theta, \psi) &= F(60° - \varphi, -\theta, \psi) \\ &\phantom{=} F(60° + \varphi, -\theta, 180° - \psi) \\ &\phantom{=} F(\varphi, 180° + \theta, 180° - \psi) \\ &\phantom{=} F(\varphi, \theta, 180° + \psi) \end{aligned} \quad (100)$$

where F is any surface wave characteristic such as electromechanical coupling coefficient $K^2$, propagation loss, TCF, PFA, or natural unidirectionality. Even if the propagation direction is reversed in sign, for example, the natural unidirectionality or PFA is regarded as being practically equivalent because its sign changes but the absolute amount remains equivalent. Although quartz is a crystal belonging to Point Group 32, it satisfies Equation (100).

For example, surface wave propagation characteristics for Eulerian angles (30°, θ, ψ) are equivalent to those for Eulerian angles (90°, 180°−θ, 180°−ψ). As another example, surface wave propagation characteristics for Eulerian angles (30°, 90°, 45°) are equivalent to those for the Eulerian angles shown in Table 1.

Although Equation (100) is not exactly satisfied if a piezoelectric film is formed on a surface of a substrate, it can provide comparable, practically acceptable surface wave propagation characteristics.

TABLE 1

| φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
a quartz substrate;
an IDT located on the quartz substrate; and
a dielectric arranged on the quartz substrate so as to cover the IDT; wherein
a boundary acoustic wave propagates across a boundary between the quartz substrate and the dielectric;
a thickness of the IDT is determined so that the velocity of the boundary acoustic wave is below those of a slow transverse wave propagating across the quartz substrate and a slow transverse wave propagating across the dielectric; and
θ and ψ of Euler angles (0°, θ, ψ) of the quartz substrate are in any one of regions surrounded by points A01 to A16, B01 to B16, C01 to C16, D01 to D13, E01 to E17, F01 to F11, G01 to G23, and H01 to H14 in the Tables 1 to 8:

TABLE 1

| | θ[°] | ψ[°] |
|---|---|---|
| A01 | 100 | 146 |
| A02 | 110 | 144 |
| A03 | 120 | 144 |
| A04 | 130 | 145 |
| A05 | 136 | 147 |
| A06 | 140 | 151 |
| A07 | 140 | 156 |
| A08 | 135 | 163 |
| A09 | 130 | 166 |
| A10 | 125 | 168 |
| A11 | 120 | 168 |
| A12 | 112 | 168 |
| A13 | 110 | 166 |
| A14 | 98 | 155 |
| A15 | 97 | 150 |
| A16 | 100 | 146 |

TABLE 2

| | θ[°] | ψ[°] |
|---|---|---|
| B01 | 83 | 100 |
| B02 | 86 | 95 |
| B03 | 92 | 93 |
| B04 | 100 | 92 |
| B05 | 150 | 86 |
| B06 | 180 | 81 |
| B07 | 180 | 110 |
| B08 | 151 | 126 |
| B09 | 140 | 128 |
| B10 | 130 | 129 |
| B11 | 120 | 129 |
| B12 | 105 | 127 |
| B13 | 95 | 122 |
| B14 | 85 | 110 |
| B15 | 83 | 105 |
| B16 | 83 | 100 |

TABLE 3

| | θ[°] | ψ[°] |
|---|---|---|
| C01 | 104 | 60 |
| C02 | 109 | 55 |
| C03 | 118 | 52 |
| C04 | 131 | 52 |
| C05 | 146 | 54 |
| C06 | 152 | 56 |
| C07 | 161 | 60 |
| C08 | 165 | 65 |
| C09 | 160 | 70 |
| C10 | 150 | 72 |
| C11 | 140 | 73 |
| C12 | 130 | 73 |
| C13 | 120 | 72 |
| C14 | 114 | 71 |
| C15 | 105 | 66 |
| C16 | 104 | 60 |

TABLE 4

| | θ[°] | ψ[°] |
|---|---|---|
| D01 | 95 | 31 |
| D02 | 100 | 36 |
| D03 | 180 | 50 |
| D04 | 180 | 19 |
| D05 | 150 | 12 |
| D06 | 140 | 11 |
| D07 | 130 | 10 |

TABLE 4-continued

|  | θ[°] | ψ[°] |
|---|---|---|
| D08 | 120 | 10 |
| D09 | 111 | 12 |
| D10 | 106 | 14 |
| D11 | 102 | 18 |
| D12 | 98 | 23 |
| D13 | 95 | 31 |

TABLE 5

|  | θ[°] | ψ[°] |
|---|---|---|
| E01 | 0 | 170 |
| E02 | 15 | 175 |
| E03 | 20 | 176 |
| E04 | 75 | 177 |
| E05 | 80 | 176 |
| E06 | 85 | 175 |
| E07 | 88 | 173 |
| E08 | 87 | 168 |
| E09 | 80 | 161 |
| E10 | 70 | 154 |
| E11 | 60 | 149 |
| E12 | 50 | 144 |
| E13 | 35 | 142 |
| E14 | 18 | 140 |
| E15 | 10 | 140 |
| E16 | 0 | 141 |
| E17 | 0 | 170 |

TABLE 6

|  | θ[°] | ψ[°] |
|---|---|---|
| F01 | 23 | 121 |
| F02 | 27 | 125 |
| F03 | 45 | 128 |
| F04 | 50 | 128 |
| F05 | 55 | 125 |
| F06 | 55 | 122 |
| F07 | 50 | 116 |
| F08 | 45 | 113 |
| F09 | 35 | 113 |
| F10 | 30 | 115 |
| F11 | 23 | 121 |

TABLE 7

|  | θ[°] | ψ[°] |
|---|---|---|
| G01 | 0 | 111 |
| G02 | 10 | 105 |
| G03 | 20 | 100 |
| G04 | 30 | 95 |
| G05 | 40 | 93 |
| G06 | 55 | 92 |
| G07 | 65 | 90 |
| G08 | 70 | 88 |
| G09 | 71 | 83 |
| G10 | 70 | 72 |
| G11 | 65 | 55 |
| G12 | 55 | 51 |
| G13 | 33 | 50 |
| G14 | 25 | 40 |
| G15 | 0 | 21 |
| G16 | 0 | 51 |
| G17 | 17 | 54 |
| G18 | 20 | 56 |
| G19 | 23 | 60 |
| G20 | 18 | 70 |
| G21 | 10 | 77 |

TABLE 7-continued

|  | θ[°] | ψ[°] |
|---|---|---|
| G22 | 0 | 82 |
| G23 | 0 | 111 |

TABLE 8

|  | θ[°] | ψ[°] |
|---|---|---|
| H01 | 22 | 11 |
| H02 | 23 | 17 |
| H03 | 33 | 25 |
| H04 | 45 | 30 |
| H05 | 52 | 31 |
| H06 | 60 | 30 |
| H07 | 69 | 26 |
| H08 | 73 | 21 |
| H09 | 72 | 15 |
| H10 | 66 | 11 |
| H11 | 46 | 6 |
| H12 | 33 | 6 |
| H13 | 26 | 8 |
| H14 | 22 | 11. |

2. The boundary acoustic wave device according to claim 1, wherein the thickness and width of each electrode finger of the IDT are determined so that the velocity of the boundary acoustic wave is below those of the slow transverse wave propagating across the quartz and the slow transverse wave propagating across the dielectric.

3. The boundary acoustic wave device according to claim 1, wherein the IDT includes IDT electrodes including at least one metal selected from the group consisting of nickel, molybdenum, iron, copper, tungsten, silver, tantalum, gold, and platinum.

4. The boundary acoustic wave device according to claim 1, wherein the dielectric is formed of polycrystalline silicon or amorphous silicon.

5. The boundary acoustic wave device according to claim 1, wherein the dielectric is formed of a material selected from the group consisting of aluminum nitride, glass, lithium tetraborate, lithium niobate, lithium tantalate, sapphire, silicon nitride, and alumina.

6. A boundary acoustic wave device comprising:
  a quartz substrate;
  an IDT located on the quartz substrate; and
  a dielectric arranged on the quartz substrate so as to cover the IDT; wherein
  a boundary acoustic wave propagates across a boundary between the quartz substrate and the dielectric;
  a thickness of the IDT is determined so that the velocity of the boundary acoustic wave is below those of a slow transverse wave propagating across the quartz substrate and a slow transverse wave propagating across the dielectric; and
  θ and ψ of Euler angles (0°, θ, ψ) of the quartz substrate are in any one of regions surrounded by points I01 to I24 and J01 to J24 in Tables 1 and 2:

TABLE 1

|  | θ[°] | ψ[°] |
|---|---|---|
| I01 | 0 | 180 |
| I02 | 28 | 180 |
| I03 | 31 | 170 |
| I04 | 43 | 158 |
| I05 | 56 | 150 |

TABLE 1-continued

| | θ[°] | ψ[°] |
|---|---|---|
| I06 | 78 | 140 |
| I07 | 78 | 134 |
| I08 | 70 | 130 |
| I09 | 60 | 124 |
| I10 | 51 | 116 |
| I11 | 43 | 106 |
| I12 | 40 | 99 |
| I13 | 37 | 91 |
| I14 | 39 | 80 |
| I15 | 50 | 65 |
| I16 | 63 | 54 |
| I17 | 78 | 44 |
| I18 | 78 | 41 |
| I19 | 60 | 32 |
| I20 | 46 | 24 |
| I21 | 33 | 16 |
| I22 | 26 | 0 |
| I23 | 0 | 0 |
| I24 | 0 | 180 |

TABLE 2

| | θ[°] | ψ[°] |
|---|---|---|
| J01 | 180 | 180 |
| J02 | 120 | 180 |
| J03 | 120 | 170 |
| J04 | 124 | 165 |
| J05 | 122 | 145 |
| J06 | 125 | 140 |
| J07 | 135 | 134 |
| J08 | 142 | 128 |
| J09 | 149 | 115 |
| J10 | 147 | 103 |
| J11 | 142 | 93 |
| J12 | 141 | 88 |
| J13 | 143 | 84 |
| J14 | 150 | 70 |
| J15 | 150 | 65 |
| J16 | 145 | 55 |
| J17 | 140 | 50 |
| J18 | 127 | 41 |
| J19 | 121 | 35 |
| J20 | 123 | 14 |
| J21 | 119 | 10 |
| J22 | 120 | 0 |
| J23 | 180 | 0 |
| J24 | 180 | 180. |

7. The boundary acoustic wave device according to claim 6, wherein the thickness and width of each electrode finger of the IDT are determined so that the velocity of the boundary acoustic wave is below those of the slow transverse wave propagating across the quartz and the slow transverse wave propagating across the dielectric.

8. The boundary acoustic wave device according to claim 6, wherein the IDT includes IDT electrodes including at least one metal selected from the group consisting of nickel, molybdenum, iron, copper, tungsten, silver, tantalum, gold, and platinum.

9. The boundary acoustic wave device according to claim 6, wherein the dielectric is formed of polycrystalline silicon or amorphous silicon.

10. The boundary acoustic wave device according to claim 6, wherein the dielectric is formed of a material selected from the group consisting of aluminum nitride, glass, lithium tetraborate, lithium niobate, lithium tantalate, sapphire, silicon nitride, and alumina.

11. A boundary acoustic wave device comprising:
a quartz substrate;
an IDT located on the quartz substrate; and
a dielectric arranged on the quartz substrate so as to cover the IDT; wherein
a boundary acoustic wave propagates across a boundary between the quartz substrate and the dielectric;
a thickness of the IDT is determined so that the velocity of the boundary acoustic wave is below those of a slow transverse wave propagating across the quartz substrate and a slow transverse wave propagating across the dielectric; and
θ and ψ of Euler angles (0°, θ, ψ) of the quartz substrate are in any one of regions surrounded by points K01 to K14, L01 to L18, M01 to M19, N01 to N15, O01 to O14, P01 to P10, Q01 to Q10, and R01 to R17 in Tables 1 to 8:

TABLE 1

| | θ[°] | ψ[°] |
|---|---|---|
| K01 | 99 | 150 |
| K02 | 99 | 155 |
| K03 | 103 | 161 |
| K04 | 111 | 167 |
| K05 | 124 | 169 |
| K06 | 142 | 165 |
| K07 | 158 | 157 |
| K08 | 161 | 150 |
| K09 | 161 | 146 |
| K10 | 152 | 142 |
| K11 | 131 | 142 |
| K12 | 118 | 144 |
| K13 | 106 | 146 |
| K14 | 99 | 150 |

TABLE 2

| | θ[°] | ψ[°] |
|---|---|---|
| L01 | 100 | 111 |
| L02 | 100 | 115 |
| L03 | 103 | 122 |
| L04 | 110 | 126 |
| L05 | 125 | 129 |
| L06 | 140 | 127 |
| L07 | 151 | 124 |
| L08 | 160 | 120 |
| L09 | 166 | 115 |
| L10 | 169 | 111 |
| L11 | 168 | 105 |
| L12 | 162 | 103 |
| L13 | 151 | 100 |
| L14 | 130 | 100 |
| L15 | 123 | 101 |
| L16 | 112 | 103 |
| L17 | 105 | 106 |
| L18 | 100 | 111 |

TABLE 3

| | θ[°] | ψ[°] |
|---|---|---|
| M01 | 100 | 66 |
| M02 | 100 | 71 |
| M03 | 105 | 75 |
| M04 | 113 | 78 |
| M05 | 129 | 81 |
| M06 | 139 | 82 |
| M07 | 146 | 82 |
| M08 | 155 | 81 |
| M09 | 160 | 79 |
| M10 | 168 | 76 |

TABLE 3-continued

|  | θ[°] | ψ[°] |
|---|---|---|
| M11 | 169 | 70 |
| M12 | 165 | 65 |
| M13 | 158 | 60 |
| M14 | 145 | 55 |
| M15 | 133 | 53 |
| M16 | 117 | 53 |
| M17 | 109 | 55 |
| M18 | 105 | 58 |
| M19 | 100 | 66 |

TABLE 4

|  | θ[°] | ψ[°] |
|---|---|---|
| N01 | 99 | 31 |
| N02 | 101 | 33 |
| N03 | 108 | 36 |
| N04 | 147 | 40 |
| N05 | 155 | 38 |
| N06 | 161 | 35 |
| N07 | 161 | 30 |
| N08 | 157 | 24 |
| N09 | 145 | 17 |
| N10 | 129 | 13 |
| N11 | 118 | 13 |
| N12 | 110 | 15 |
| N13 | 103 | 20 |
| N14 | 99 | 26 |
| N15 | 99 | 31 |

TABLE 5

|  | θ[°] | ψ[°] |
|---|---|---|
| O01 | 10 | 165 |
| O02 | 17 | 172 |
| O03 | 32 | 175 |
| O04 | 48 | 175 |
| O05 | 62 | 173 |
| O06 | 76 | 166 |
| O07 | 76 | 162 |
| O08 | 70 | 155 |
| O09 | 60 | 151 |
| O10 | 47 | 147 |
| O11 | 35 | 147 |
| O12 | 20 | 151 |
| O13 | 12 | 157 |
| O14 | 10 | 165 |

TABLE 6

|  | θ[°] | ψ[°] |
|---|---|---|
| P01 | 28 | 121 |
| P02 | 30 | 124 |
| P03 | 35 | 126 |
| P04 | 51 | 126 |
| P05 | 56 | 121 |
| P06 | 56 | 111 |
| P07 | 48 | 104 |
| P08 | 36 | 104 |

TABLE 6-continued

|  | θ[°] | ψ[°] |
|---|---|---|
| P09 | 28 | 110 |
| P10 | 28 | 121 |

TABLE 7

|  | θ[°] | ψ[°] |
|---|---|---|
| Q01 | 29 | 72 |
| Q02 | 36 | 77 |
| Q03 | 48 | 77 |
| Q04 | 56 | 70 |
| Q05 | 56 | 60 |
| Q06 | 51 | 55 |
| Q07 | 40 | 55 |
| Q08 | 30 | 58 |
| Q09 | 28 | 62 |
| Q10 | 29 | 72 |

TABLE 8

|  | θ[°] | ψ[°] |
|---|---|---|
| R01 | 10 | 15 |
| R02 | 13 | 25 |
| R03 | 16 | 27 |
| R04 | 20 | 30 |
| R05 | 26 | 32 |
| R06 | 40 | 34 |
| R07 | 48 | 34 |
| R08 | 55 | 32 |
| R09 | 70 | 25 |
| R10 | 73 | 24 |
| R11 | 76 | 19 |
| R12 | 76 | 14 |
| R13 | 65 | 9 |
| R14 | 52 | 7 |
| R15 | 30 | 7 |
| R16 | 17 | 9 |
| R17 | 10 | 15. |

12. The boundary acoustic wave device according to claim 11, wherein the thickness and width of each electrode finger of the IDT are determined so that the velocity of the boundary acoustic wave is below those of the slow transverse wave propagating across the quartz and the slow transverse wave propagating across the dielectric.

13. The boundary acoustic wave device according to claim 11, wherein the IDT includes IDT electrodes including at least one metal selected from the group consisting of nickel, molybdenum, iron, copper, tungsten, silver, tantalum, gold, and platinum.

14. The boundary acoustic wave device according to claim 11, wherein the dielectric is formed of polycrystalline silicon or amorphous silicon.

15. The boundary acoustic wave device according to claim 11, wherein the dielectric is formed of a material selected from the group consisting of aluminum nitride, glass, lithium tetraborate, lithium niobate, lithium tantalate, sapphire, silicon nitride, and alumina.

* * * * *